United States Patent
Schaper

(10) Patent No.: US 7,185,696 B2
(45) Date of Patent: Mar. 6, 2007

(54) COOLING ELEMENT FOR HEAT DISSIPATION IN ELECTRONIC COMPONENTS

(75) Inventor: Elmar Schaper, Luegde (DE)

(73) Assignee: Phoenix Contact GmbH & Co., KG, Blomberg (DE)

( * ) Notice: Subject to any disclaimer, the term of this patent is extended or adjusted under 35 U.S.C. 154(b) by 0 days.

(21) Appl. No.: 10/863,565

(22) Filed: Jun. 8, 2004

(65) Prior Publication Data

US 2004/0250990 A1 Dec. 16, 2004

(30) Foreign Application Priority Data

Jun. 12, 2003 (DE) ................. 103 26 458

(51) Int. Cl.
*F28F 7/00* (2006.01)
*H05K 7/20* (2006.01)

(52) U.S. Cl. ............... 165/80.2; 165/185; 361/688

(58) Field of Classification Search ............ 165/80.3, 165/185, 104.33, 76, 78, 67–69; 174/16.3; 361/697, 704, 707, 709; 257/706–707, 718–719
See application file for complete search history.

(56) References Cited

U.S. PATENT DOCUMENTS

| | | | | | |
|---|---|---|---|---|---|
| 2,861,782 | A | * | 11/1958 | Elmer | 165/80.3 |
| 4,233,645 | A | * | 11/1980 | Balderes et al. | 361/698 |
| 4,509,839 | A | * | 4/1985 | Lavochkin | 257/718 |
| 4,563,725 | A | * | 1/1986 | Kirby | 361/708 |
| 4,703,181 | A | * | 10/1987 | Swann et al. | 250/442.11 |
| 4,933,746 | A | * | 6/1990 | King | 257/718 |
| 5,241,453 | A | * | 8/1993 | Bright et al. | 361/704 |
| 5,466,970 | A | * | 11/1995 | Smithers | 257/712 |
| 5,640,304 | A | | 6/1997 | Hellinga et al. | |
| 5,926,369 | A | * | 7/1999 | Ingraham et al. | 361/699 |
| 5,991,151 | A | * | 11/1999 | Capriz | 361/704 |
| 6,771,504 | B2 | * | 8/2004 | Barcley | 361/704 |
| 2001/0030037 | A1 | * | 10/2001 | Hellbruck et al. | 165/80.3 |
| 2001/0042638 | A1 | * | 11/2001 | Yamada et al. | 174/260 |

FOREIGN PATENT DOCUMENTS

| | | |
|---|---|---|
| DE | 3803469 | 8/1989 |
| DE | 29612437 | 10/1996 |
| DE | 19538642 | 4/1997 |
| DE | 19729851 | 1/1999 |

* cited by examiner

*Primary Examiner*—Tho Duong
(74) *Attorney, Agent, or Firm*—Darby & Darby

(57) ABSTRACT

A cooling element for heat dissipation in one or more electronic components includes a metal element with one or more slit-shaped receiving openings for one or more electronic components that are to be cooled. In its lengthwise extension, each receiving opening has a receiving bore that holds a helical spring and that runs parallel to the lengthwise extension. The receiving bore is arranged in such a way that it is open on the lengthwise side towards the receiving opening and the spring placed in it projects with a radial partial section into the receiving opening that holds the electronic component. As a result, in partial areas, the spring presses the electronic component against the inner wall of the receiving opening that lies opposite from the spring, thus establishing thermal contact.

1 Claim, 4 Drawing Sheets

COOLING ELEMENT FOR HEAT DISSIPATION IN ELECTRONIC COMPONENTS

Priority is claimed to German patent application DE 103 26 458.2, the subject matter of which is hereby incorporated by reference herein.

The invention relates to a cooling element for heat dissipation in one or more electronic components, consisting of a heat-dissipating metal element and pressure means that serve to press the electronic component against the metal element.

BACKGROUND

German utility model DE 296 12 437 U1 discloses a cooling element for an electronic component, consisting of a metal element and of a passage opening to receive the electronic component. Through the insertion of a leaf spring, the electronic component is brought into thermal contact with a wall of the metal element. The drawback here is that, in an additional assembly step, the spring has to be subsequently inserted into the opening that receives the electronic component.

German patent application DE 197 29 851 A1 discloses a cooling element consisting of a metal element in which the thermal contact with the electronic component is achieved by means of a leaf spring. This leaf spring, however, functions like a clamping spring and it pulls the electronic component towards the outer wall of the metal element. The assembly of such a cooling element is impractical when conventional electronics housings are used since the electronic component to be cooled has to project out of the electronics housing in order to be brought into thermal contact with the cooling element.

SUMMARY OF THE INVENTION

An object of the present invention is to provide a cooling element for one or more electronic components arranged next to or behind each other, including a heat-dissipating metal element and at least one pressure means whereby, in a simple manner, one or more electronic components to be cooled are brought into thermal contact with the cooling element.

The present invention provides a cooling element for one or more electronic components. The cooling element includes a metal element defining a receiving opening configured to receive electronic component and defining a receiving bore associated with the receiving opening; and a spring disposed in the receiving bore so as to urge the electronic component against an inner wall of the receiving opening.

The present invention also provides a method for establishing thermal contact between one or more electronic components and a cooling element for heat dissipation. The method includes disposing a spring in a receiving bore of the metal element; and inserting an electronic component into a receiving opening of the metal element so that the electronic component is urged against an inner wall of the receiving opening by a radial return force of the spring.

The metal element of the cooling element has one or more slit-shaped receiving openings for one or more electronic components that are to be cooled in each receiving opening. In its lengthwise extension, each receiving opening has a receiving bore that holds a helical spring and that runs parallel to the lengthwise extension. The receiving bore is arranged in such a way that it is open on the lengthwise side towards the receiving opening. The receiving bore is arranged in such a way that the lateral opening faces in the direction of the electronic component. A helical spring is placed into the receiving bore and a radial partial section of said spring projects into the opening for receiving the electronic component. When the electronic component is inserted into the receiving opening in the cooling element, the radial return force of the helical spring presses the electronic component against the opposite inner wall of the receiving opening. Advantageously, several electronic components next to each other in the receiving opening can be simultaneously brought into thermal contact with the cooling element. This is the case, for instance, when the cooling element is mounted on a printed circuit board in which the electronic components to be cooled are positioned in such a way that they match the receiving openings and can thus be inserted simultaneously into the receiving openings. The helical spring is essentially only deformed where the electronic component is pressed against the cooling element, so that a virtually uniform pressing force is ensured for each electronic component. In another embodiment, for purposes of pressing the electronic component against the cooling element, springs that have a tubular, radial action, or else permanently flexible plastic cylinders or rubber cylinders can be used.

In an embodiment of the cooling element, several receiving openings with the appertaining receiving bores can be provided.

The metal element is preferably made of extruded metal since the receiving openings for one or more electronic components can be designed as a continuous shaft in the lengthwise direction. The receiving bore for the cylindrical spring runs in the axial direction parallel to the continuous shaft that runs in the longitudinal direction for the opening for receiving one or more electronic components. Another advantage of the invention is that the length and height of the receiving opening can be dimensioned in such a way that electronic components of different sizes can be inserted into the receiving opening. Another advantage of the cooling element according to the invention is that several electronic components to be cooled are inserted simultaneously into one or more receiving openings. In this context, the spring(s) is/are preferably placed or slid into the receiving bore(s) prior to the insertion of the electronic components to be cooled.

In an embodiment, two opposite extensions of the metal element form side walls on the side of the component insertion guide of the cooling element, as a result of which these side walls serve as spacers relative to a printed circuit board.

The cooling element according to the invention is not limited to heat dissipation for electronic components since other applications such as heat dissipation for electromechanical components such as, for example, relays or solenoid valves, are also included.

BRIEF DESCRIPTION OF THE DRAWINGS

The invention will be described below based on an embodiment with reference to the drawings, in which.

DETAILED DESCRIPTION

Figure 1:
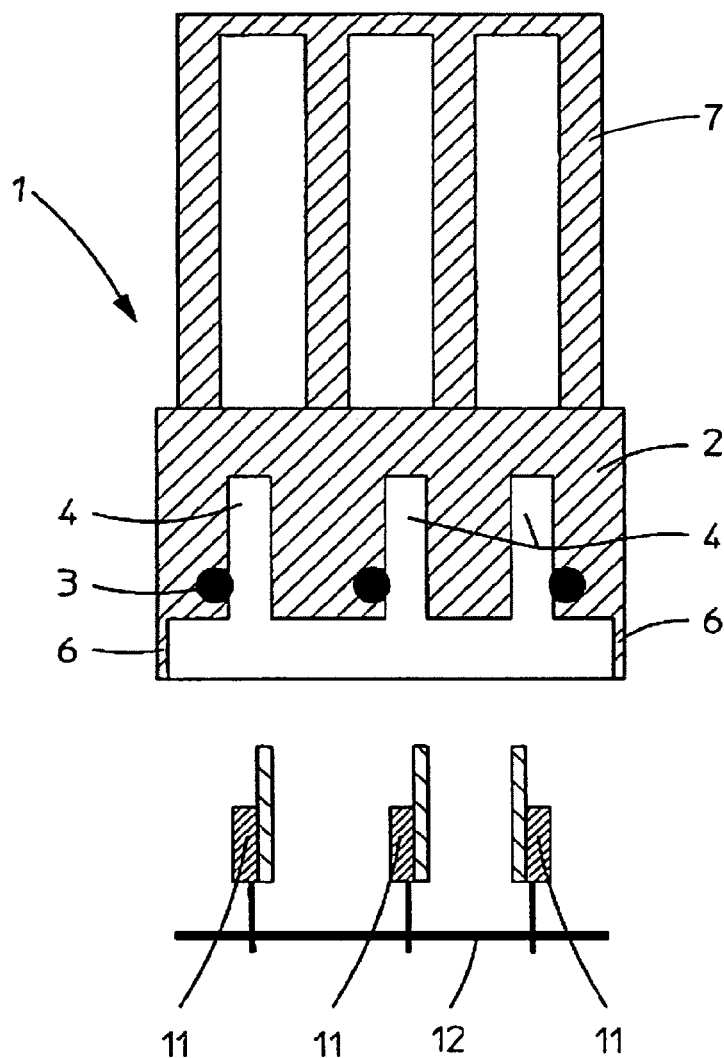
FIG. 1 shows a cooling element in a front sectional view.
Figure 2:
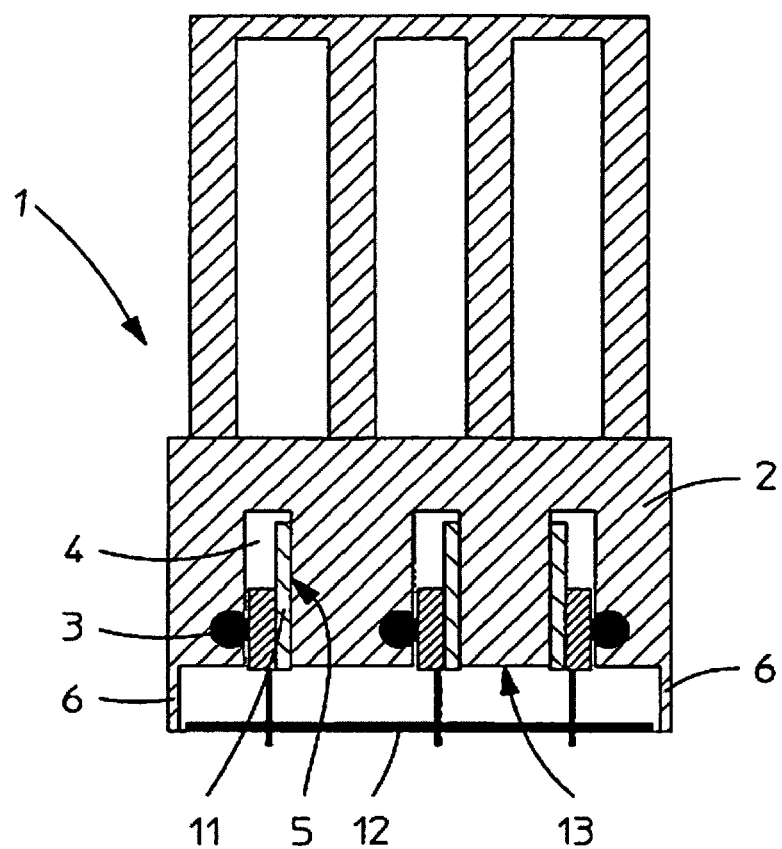
FIG. 2 shows a cooling element in conjunction with thermally contacted electronic components.
Figure 3A:
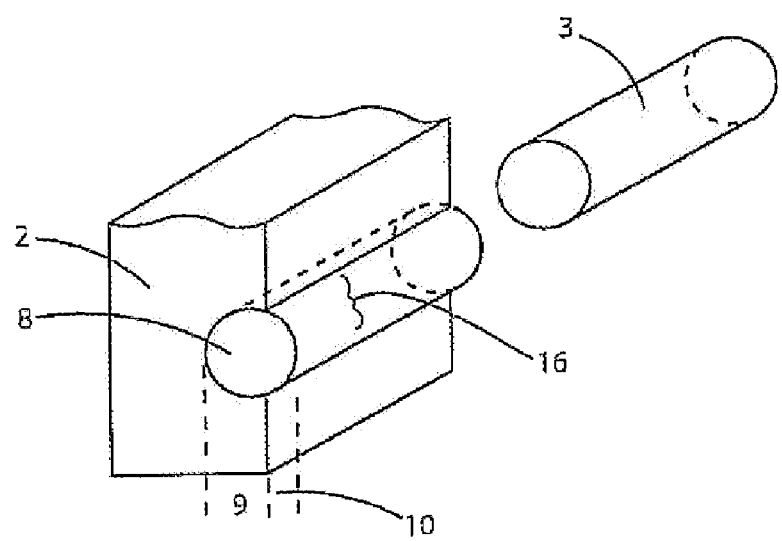
FIG. 3a shows a detailed view of the area of a receiving bore for a spring.

FIG. 1 depicts the cooling element 1 according to the invention in a front sectional view. In addition to its cooling fins 7, the metal element 2 also has receiving openings 4 running in the longitudinal direction for receiving one or more electronic components 11. A receiving bore running parallel to the receiving opening 4 holds the helical spring 3. As shown in FIG. 2, the electronic component 11 is pressed against the inner wall 5 of the receiving opening 4 and thus brought into thermal contact with the metal element 2. The spring 3, which is cylindrical in shape, presses from the side located opposite from the inner wall 5 against the electronic component 11. The side walls 6 partially enclose the printed circuit board 12 on one or two sides, thus ensuring that the printed circuit board 12 remains at a distance from the bottom 13 of the cooling element 1. FIG. 3a shows a detailed and perspective view of the area of the receiving bore 8 for the spring 3. Here, the receiving bore 8 is in a first radial partial section 9 in the metal element 2. When inserted in the bore 8, spring 3 extends into the receiving opening 4. The first radial partial section 9 is designed to be larger than the second radial partial section 10, as a result of which the lateral opening 16 thus formed is narrower than the diameter of the receiving bore 8. This dimensioning prevents the spring 3 from falling out of the receiving bore 8 that holds the spring into the receiving opening 4 that holds at least one electronic component 11.

Figure 3B:
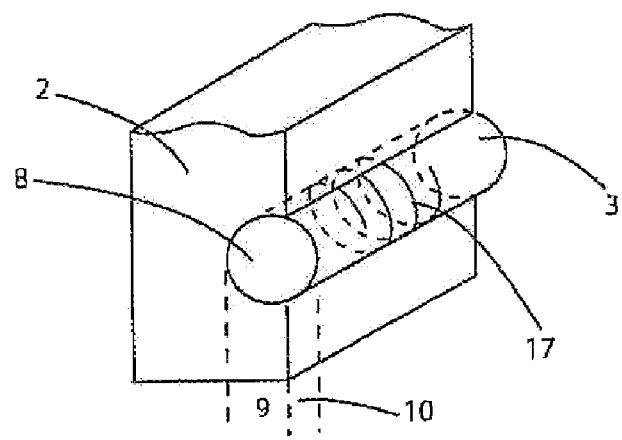
FIG. 3b shows a detailed view of an area of a receiving bore with a spring inserted into the receiving bore.
Figure 3C:
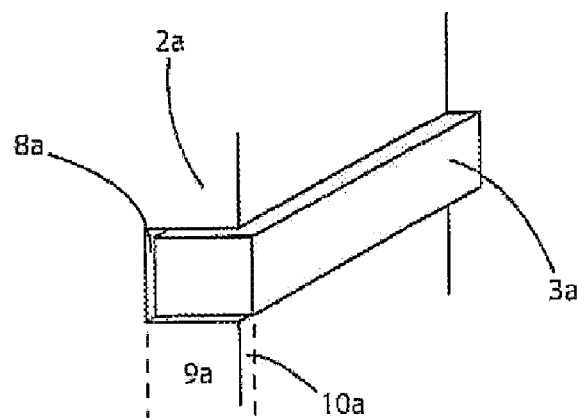
FIG. 3c shows a detailed view of an area of a receiving bore having a rectangular shape and with a spring inserted into the receiving bore.

FIG. 3b shows a detailed and perspective view of the area of the receiving bore 8 for the spring 3, whereby here, the spring 3 has been inserted into the receiving bore 8 and includes helical spring 17. Here, it can be clearly seen that the spring 3 extends by a second partial section 10 into the receiving opening 4 for the electronic component 11. Different types are conceivable for the spring 3. Aside from a generally known coil, or helical, spring—which in this embodiment, however, acts in the radial direction instead of in the axial direction—springs that have a tubular, axial action, or else solid, permanently flexible plastic cylinders or rubber cylinders are likewise conceivable. FIG. 3c shows by way of an example the receiving bore 8a in a rectangular shape, whereby the spring 3a inserted into it lies in a partial section 9a in the metal element 2a, and projects in a partial section 10a into the receiving opening 4 that holds at least one electronic component 11.

Figure 4A:
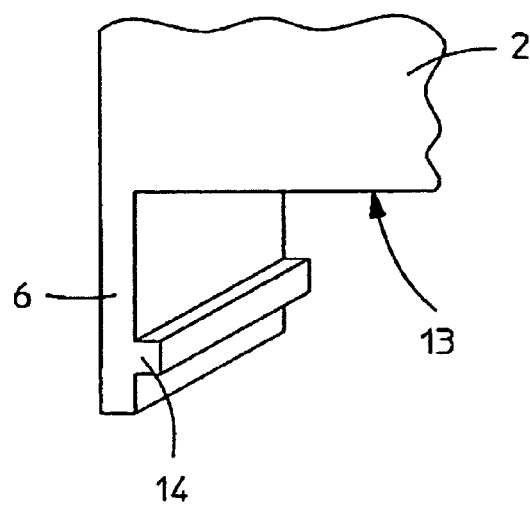
FIGS. 4a, 4b show a detailed view of side walls.
Figure 4B:
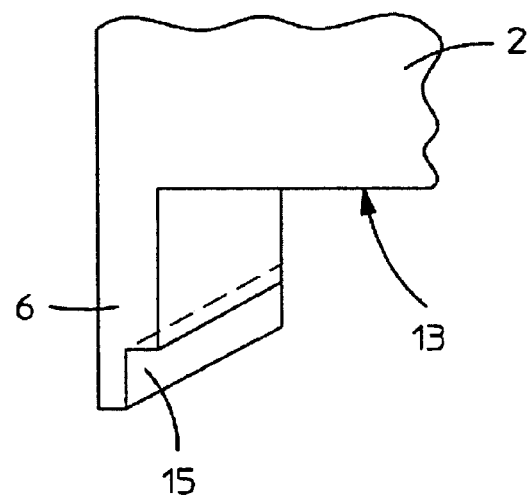

FIG. 4a shows a preferred embodiment with the side wall 6 that is shaped onto the bottom 13 of the metal element 2. In an embodiment, there is a ridge 14 shaped onto the inside of the side walls 6 for purposes of guiding or positioning a printed circuit board 12 towards the metal element 2. FIG. 4b shows another preferred embodiment with the above-mentioned side wall 6 which, in order to guide or position a printed circuit board 12 towards the metal element 2, has at least one step 15 shaped onto the inside of the side walls 6.

LIST OF REFERENCE NUMERALS 1 cooling element
2 metal element
3 spring
4 receiving opening for an electronic component
5 inner wall
6 side wall
7 cooling fins
8 receiving bore for a spring
9 first radial partial section of the receiving bore
10 second radial partial section of the receiving bore
11 electronic component
12 printed circuit board
13 bottom of the cooling element
14 ridge
15 step
16 lateral opening

What is claimed is:

1. A cooling element for one or more electronic components, the cooling element comprising:
    a metal element defining a receiving opening configured to receive an electronic component and defining a receiving bore associated with the receiving opening; and
    a spring disposed in the receiving bore so that an insertion of the electronic component deforms the spring so as to urge the electronic component against an inner wall of the receiving opening;
    wherein a radial return force of the spring urges the electronic component against the inner wall so as to establish a thermal contact between the electronic component and the inner wall;
    wherein the spring includes at least one of a permanently flexible solid plastic cylinder and a permanently flexible rubber cylinder.

* * * * *